(12) United States Patent
Kim et al.

(10) Patent No.: US 11,737,331 B2
(45) Date of Patent: Aug. 22, 2023

(54) DISPLAY PANEL INCLUDING NON-UNIFORM PIXEL DENSITY AND DISPLAY DEVICE INCLUDING THE SAME

(71) Applicant: Samsung Display Co., Ltd., Yongin-Si (KR)

(72) Inventors: Hwi Kim, Suwon-si (KR); Jeongkuk Kim, Suwon-si (KR); Areum Lee, Suwon-si (KR); Seungyong Song, Suwon-si (KR); Kyu Hwan Hwang, Seongnam-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 255 days.

(21) Appl. No.: 17/174,521

(22) Filed: Feb. 12, 2021

(65) Prior Publication Data

US 2022/0013596 A1    Jan. 13, 2022

(30) Foreign Application Priority Data

Jul. 8, 2020    (KR) .......................... 10-2020-0083928

(51) Int. Cl.
*H10K 59/35*    (2023.01)
*H10K 50/84*    (2023.01)
*H10K 59/12*    (2023.01)
*H10K 102/00*   (2023.01)

(52) U.S. Cl.
CPC ............. *H10K 59/35* (2023.02); *H10K 50/84* (2023.02); *H10K 59/12* (2023.02); *H10K 2102/311* (2023.02)

(58) Field of Classification Search
CPC ............. H01L 27/3211; H01L 51/5237; H01L 2251/5338

USPC ........................................................... 257/89
See application file for complete search history.

(56) References Cited

U.S. PATENT DOCUMENTS

| | | | |
|---|---|---|---|
| 9,336,703 | B2 | 5/2016 | Kim |
| 2019/0073946 | A1 | 3/2019 | Su |
| 2020/0066802 | A1* | 2/2020 | Lee .................... H01L 27/323 |

(Continued)

FOREIGN PATENT DOCUMENTS

| | | | |
|---|---|---|---|
| EP | 3660818 | A1 | 6/2020 |
| EP | 3813121 | A1 | 4/2021 |
| KR | 1020150012542 | A | 2/2015 |

(Continued)

OTHER PUBLICATIONS

Extended European Search Report for Application No. 21179338.5-1203 dated Nov. 19, 2021.

*Primary Examiner* — Xia L Cross
(74) *Attorney, Agent, or Firm* — Cantor Colburn LLP

(57) ABSTRACT

The present application relates to a display device. The display device includes a window including a front area and a corner area, and a display panel coupled to the window. The display panel includes a first area and a second area corresponding to the front area and the corner area, respectively. The second area includes a plurality of unit areas, a plurality of stretchable areas disposed between the plurality of unit areas, where a plurality of opening areas are defined through the display panel to be adjacent to the plurality of unit areas. A light emitting area of the second area has an area greater than an area of a corresponding light emitting area of the first area.

20 Claims, 14 Drawing Sheets

(56) References Cited

U.S. PATENT DOCUMENTS

2020/0176696 A1    6/2020  Dai
2021/0065625 A1*   3/2021  Wang .................... G09G 3/2074

FOREIGN PATENT DOCUMENTS

| KR | 1020190053021 A | 5/2019 |
| KR | 102037727 B1 | 10/2019 |
| WO | 2019242352 A1 | 12/2019 |

* cited by examiner

DISPLAY PANEL INCLUDING NON-UNIFORM PIXEL DENSITY AND DISPLAY DEVICE INCLUDING THE SAME

BACKGROUND

1. Field

The disclosure herein relates to a display panel and a display device, and more particularly, to a display panel that is attachable to an enlarged area having multi-curvatures and a display device including a corner area having multi-curvatures.

2. Description of the Related Art

Various electronic devices used in multimedia devices such as televisions, mobile phones, tablet computers, navigation units, and game consoles have been developed.

In recent years, researches for reducing a non-display area, on which an image is not displayed, in the electronic device have been performed according to market demand. At the same time, researches for enlarging a display area, on which an image is displayed for a user, in the electronic device have been performed.

SUMMARY

The disclosure provides a display panel including two kinds of unit areas.

The disclosure also provides a display device in which brightness of a corner area having multi-curvatures is compensated.

An embodiment of the invention provides a display device including: a window including a front area, a first side area bent from a first side of the front area and having a first curvature, a second side area bent from a second side of the front area and having a second curvature, and a corner area disposed between the first side area and the second side area; and a display panel coupled to the window. In such an embodiment, the display panel includes: a first area corresponding to the front area, the first side area, and the second side area of the window, where first, second, and third light emitting areas are disposed in the first area; and a second area corresponding to the corner area of the window. In such an embodiment, at least a partial area of the second area includes: a plurality of first unit areas, where the first, second, and third light emitting areas are disposed in each of the plurality of first unit areas; and a plurality of stretchable areas disposed between the plurality of first unit areas, where a plurality of opening areas are defined through the display panel to be adjacent to the plurality of first unit areas and the plurality of stretchable areas. In such an embodiment, each of the first, second, and third light emitting areas of the second area has an area greater than an area of a corresponding light emitting area of the first, second, and third light emitting areas of the first area.

In an embodiment, the first area may include a plurality of second unit areas, the first, second, and third light emitting areas may be disposed in each of the plurality of second unit areas, and the first, second, and third light emitting areas in each of the plurality of first unit areas may have a same arrangement as the first, second, and third light emitting areas in each of the plurality of second unit areas.

In an embodiment, the plurality of first unit areas and the plurality of opening areas may be alternately disposed in a first direction and the plurality of first unit areas and the plurality of opening areas may be alternately disposed in a second direction crossing the first direction.

In an embodiment, a plurality of stripe areas may be defined in the second area, each of the plurality of stripe areas may include corresponding first unit areas of the plurality of first unit areas, each of the plurality of stripe areas may expend along a first direction, and the plurality of stripe areas and the plurality of opening areas may be alternately disposed in a second direction crossing the first direction.

In an embodiment, the corner area may have a plurality of curvatures.

In an embodiment, a minimum curvature of the plurality of curvatures of the corner area may be less than each of the first curvature and the second curvature.

In an embodiment, each of the plurality of first unit areas may further include a fourth light emitting area.

In an embodiment, the first area may further include a fourth light emitting area, the first area may include a plurality of second unit areas, the first, second, third, and fourth light emitting areas may be disposed in each of the plurality of second unit areas, and the first, second, third, and fourth light emitting areas in each of the plurality of first unit areas may have a same arrangement as the first, second, third, and fourth light emitting areas in each of the plurality of second unit areas.

In an embodiment, two light emitting areas of the first, second, third, and fourth light emitting areas of each of the plurality of first unit areas may generate light having a same color as each other.

In an embodiment, at least a portion of each of the plurality of stretchable areas may have a curved line shape.

In an embodiment, the partial area of the second area may be defined as an outside area, and the second area may further include an inside area disposed adjacent to the outside area. In such an embodiment, the inside area may include: a plurality of third unit areas, where the first, second, and third light emitting areas are disposed in each of the plurality of third unit areas; and a plurality of fourth unit areas disposed adjacent to the plurality of third unit areas. In such an embodiment, the first, second, and third light emitting areas may not be disposed in each of the plurality of fourth unit areas, and each of the plurality of fourth unit areas may have an area corresponding to each of the plurality of third unit areas.

In an embodiment of the invention, a display device includes: a window including a front area, a first side area bent from a first side of the front area and having a first curvature, a second side area bent from a second side of the front area and having a second curvature, and a corner area disposed between the first side area and the second side area; and a display panel coupled to the window. In such an embodiment, the display panel includes: a first area corresponding to the front area, the first side area, and the second side area, where first, second, and third light emitting areas are disposed in the first areas; and a second area corresponding to the corner area, where the first, second, and third light emitting areas are disposed in the second area. In such an embodiment, the number of the first, second, and third light emitting areas per a unit area in the first area is greater than a number of the first, second, and third light emitting areas per the unit area in the second area, and each of the first, second, and third light emitting areas of the second area has an area greater than area of a corresponding light emitting area of the first, second, and third light emitting areas of the first area.

In an embodiment, a plurality of opening areas may be defined through the display panel in the second area.

In an embodiment, the second area may include: a plurality of first unit areas, where the first, second, and third light emitting areas are disposed in each of the plurality of first unit areas; and a plurality of stretchable areas disposed between the plurality of first unit areas and disposed adjacent to the plurality of opening areas.

In an embodiment, the second area may include a plurality of first unit areas, where the first, second, and third light emitting areas are disposed in each of the plurality of first unit areas, a plurality of stripe areas may be defined in the second area, each of the plurality of stripe areas may include corresponding first unit areas of the plurality of first unit areas, each of the plurality of stripe areas may expend along a first direction, and the plurality of stripe areas and the plurality of opening areas may be alternately disposed in a second direction crossing the first direction.

In an embodiment of the invention, a display panel includes: a first area in which first, second, and third light emitting areas are disposed; and a second area disposed adjacent to the first area, in which the first, second, and third light emitting areas are disposed, and in which a plurality of opening areas are defined. In such an embodiment, a number of the first, second, and third light emitting areas per a unit area in the first area is greater than a number of the first, second, and third light emitting areas per the unit area in the second area, and each of the first, second, and third light emitting areas of the second area has an area greater than an area of a corresponding light emitting area of the first, second, and third light emitting areas of the first area.

In an embodiment, the second area may include: a plurality of unit areas, where the first, second, and third light emitting areas are disposed in each of the plurality of unit areas; and a plurality of stretchable areas disposed between the plurality of unit areas.

In an embodiment, the second area may include: an outside area in which the plurality of opening areas are defined; and an inside area in which the plurality of opening areas are not defined.

In an embodiment, the first, second, and third light emitting areas of the outside area may have a same arrangement as the first, second, and third light emitting areas of the inside area.

In an embodiment, the second area may include a plurality of unit areas, the first light emitting area may generate a first color light, the second light emitting area may generate a second color light, the third light emitting area may generate a third color light, and one first light emitting area, one second light emitting area, and two third light emitting areas may be disposed in each of the plurality of unit areas.

BRIEF DESCRIPTION OF THE FIGURES

The above and other features of the invention will become more apparent by describing in further detail embodiments thereof with reference to the accompanying drawings, in which.

DETAILED DESCRIPTION

Figure 1A:
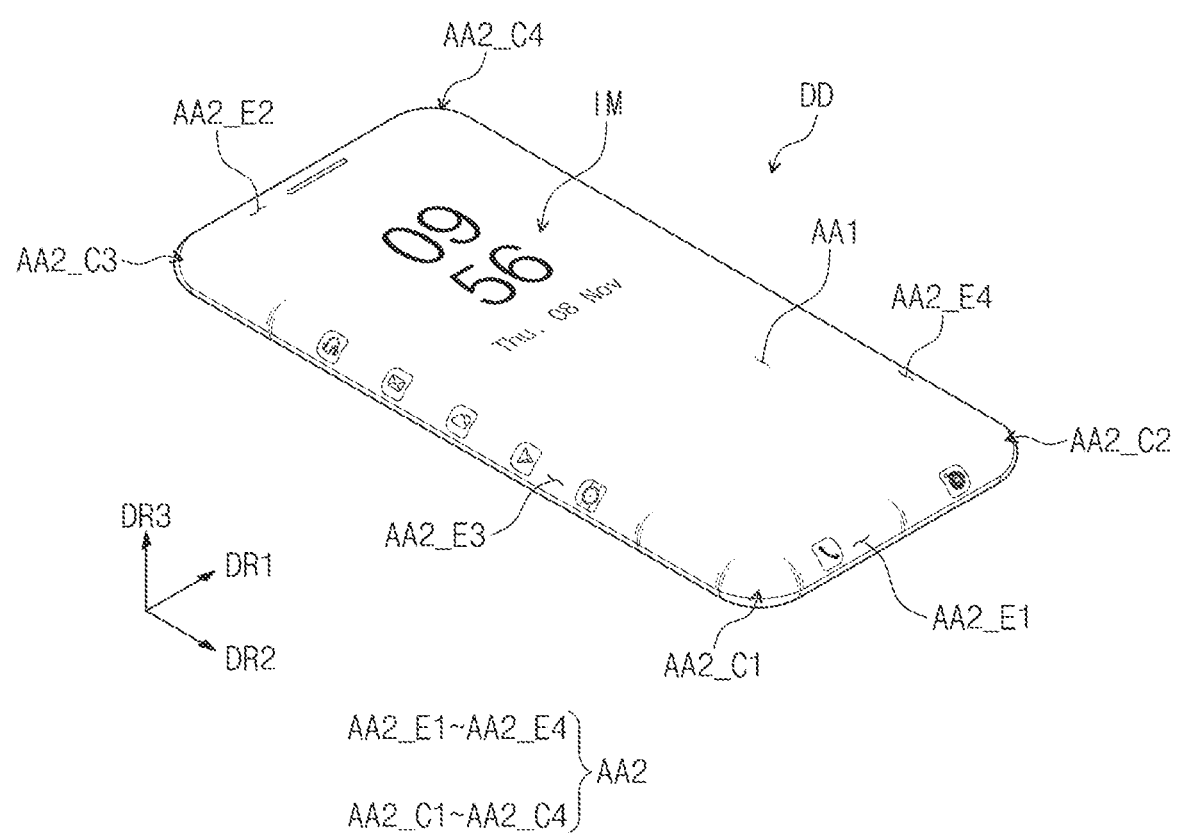
FIG. 1A is a perspective view illustrating a display device according to an embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will also be understood that when one component (or region, layer, portion) is referred to as being 'on', 'connected to', or 'coupled to' another component, it can be directly disposed/connected/coupled on/to another component, or an intervening third component may also be present therebetween. In contrast, when an element is referred to as being 'directly on', 'connected directly to', or 'coupled directly to' another element, there are no intervening elements present.

In the figures, the thickness, ratio, and dimensions of components are exaggerated for clarity of illustration.

It will be understood that although the terms such as 'first' and 'second' are used herein to describe various elements, these elements should not be limited by these terms. The terms are only used to distinguish one component from other components. For example, an element referred to as a first element in one embodiment can be referred to as a second element in another embodiment without departing from the scope of the appended claims. The terms of a singular form may include plural forms unless referred to the contrary.

Also, spatially relative terms, such as "below", "lower", "above", and "upper", may be used herein for ease of description to describe an element and/or a feature's relationship to another element(s) and/or feature(s) as illustrated in the drawings. The terms may be a relative concept and described based on directions expressed in the drawings.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, components and/or groups thereof, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as generally understood by those skilled in the art. Terms as defined in a commonly used dictionary should be construed as having the same meaning as in an associated technical context, and unless defined apparently in the description, the terms are not ideally or excessively construed as having formal meaning.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

Figure 1B:
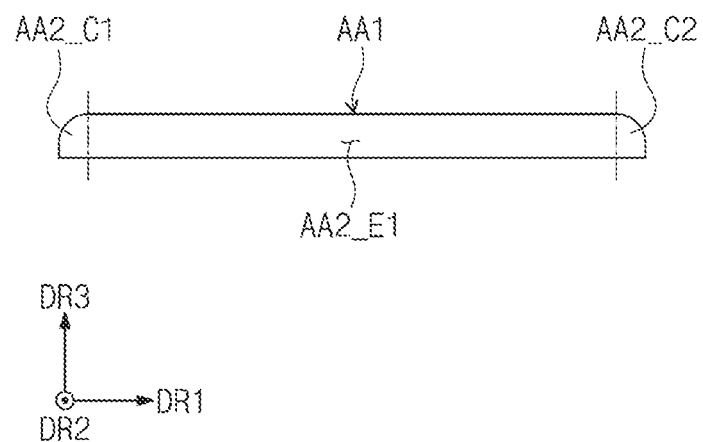
FIG. 1B is a side view illustrating the display device in FIG. 1A when viewed in a second direction DR2.
Figure 1C:
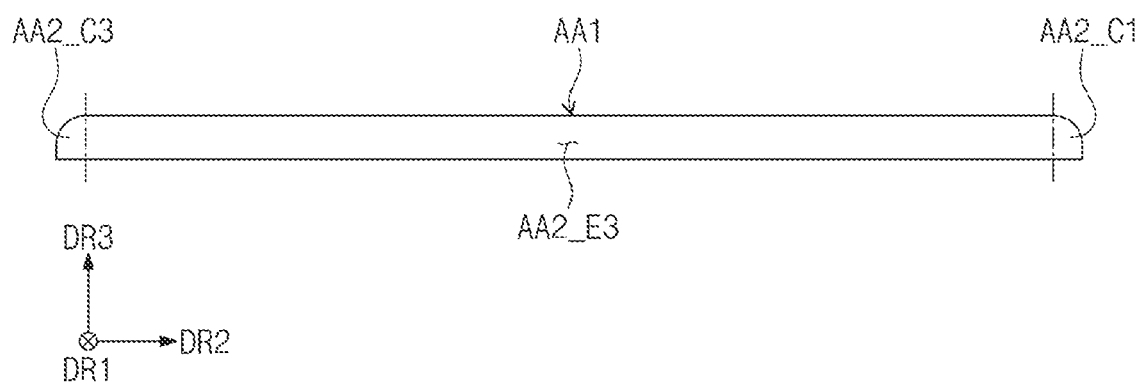
FIG. 1C is a side view illustrating the display device in FIG. 1A when viewed in a first direction DR1.
Figure 1D:
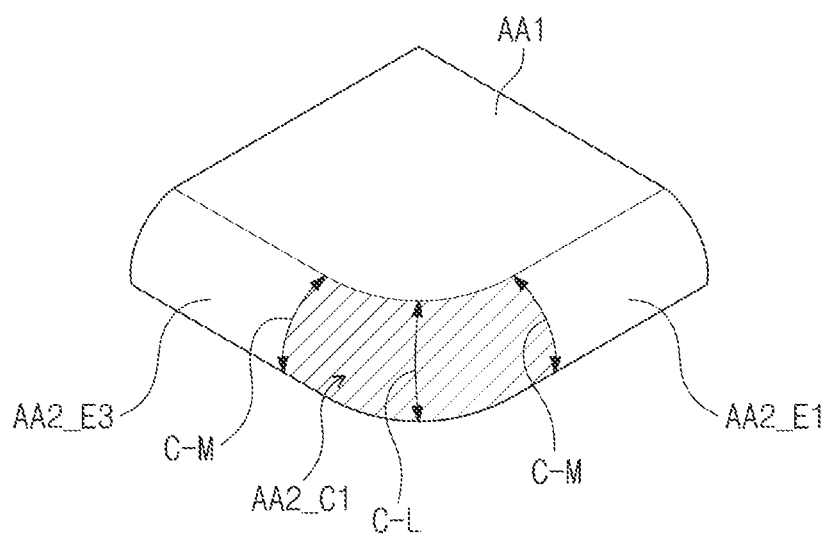
FIG. 1D is a perspective view illustrating a corner active area of the display device in FIG. 1A.
Figure 1D:
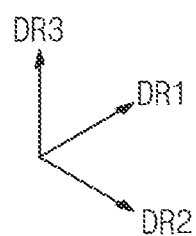

FIG. 1A is a perspective view illustrating a display device DD according to an embodiment of the invention, FIG. 1B is a side view illustrating the display device DD in FIG. 1A when viewed in a second direction DR2, and FIG. 1C is a side view illustrating the display device DD in FIG. 1A when viewed in a first direction DR1. FIG. 1D is a perspective view illustrating a corner active area AA2_C1 of the display device DD in FIG. 1A.

In FIGS. 1A to 1D, for convenience of illustration and description, an embodiment where the display device DD is a smart phone is illustrated. However, the embodiment of the invention is not limited thereto. In an embodiment of the invention, the display device DD may include large-sized electronic devices such as televisions and monitors and small and medium-sized electronic devices such as mobile phones, tablet computers, navigation units for vehicles, game consoles, or smart watches, for example.

In an embodiment of the display device DD, a three-dimensional active area AA1 and AA2 on which an image IM is displayed may be defined. In an embodiment, as shown in FIG. 1A, the image IM may be images of a date, a time, and an icon.

The active area AA1 and AA2 may include a first active area AA1 having a plane shape and a second active area AA2 bent from the first active area AA1. The second active area AA2 may be an area bent with a predetermined curvature from the first active area AA1. However, the embodiment of the invention is not limited to the shape of the second active area AA2. The first and second active areas AA1 and AA2 may be defined by portions having different shapes of a single unitary display surface.

Although not separately shown, an image may not be displayed on a partial area of the second active area AA2. In one embodiment, for example, a bezel area may be defined along an edge of the second active area AA2.

The first active area AA1 is parallel to a surface defined by a first direction DR1 and a second direction DR2. A normal direction of the first active area AA1, i.e., a thickness direction of the display device DD, may be parallel to a third direction DR3. A front surface (or a top surface) and a rear surface (or a bottom surface) of each of members of the display device DD are distinguished by the third direction DR3. Although the first to third directions DR1, DR2, and DR3 are exemplarily defined in FIG. 1A, the first to third directions DR1, DR2, and DR3 may be defined differently from FIG. 1A.

The second active area AA2 may be an area bent and extending from the first active area AA1. The second active area AA2 may include edge active areas AA2_E1 to AA2_E4 bent from one sides of the first active area AA1 and corner active areas AA2_C1 to AA2_C4 disposed at corners of the first active area AA1.

The second active area AA2 includes a first edge active area AA2_E1 bent from a first side of the first active area AA1, a second edge active area AA2_E2 bent from a second side of the first active area AA1, a third edge active area AA2_E3 bent from a third side of the first active area AA1, and a fourth edge active area AA2_E4 bent from a fourth side of the first active area AA1. The second active area AA2 includes a first corner active area AA2_C1 disposed at a first corner of the first active area AA1, a second corner active area AA2_C2 disposed at a second corner of the first active area AA1, a third corner active area AA2_C3 disposed at a third corner of the first active area AA1, and a fourth corner active area AA2_C4 disposed at a fourth corner of the first active area AA1.

The first corner active area AA2_C1 is disposed between the first edge active area AA2_E1 and the third edge active area AA2_E3, and the second corner active area AA2_C2 is disposed between the first edge active area AA2_E1 and the fourth edge active area AA2_E4. The third corner active area AA2_C3 is disposed between the second edge active area AA2_E2 and the third edge active area AA2_E3, and the fourth corner active area AA2_C4 is disposed between the second edge active area AA2_E2 and the fourth edge active area AA2_E4. However, the embodiment of the invention is not limited to the number of each of the edge active areas AA2_E1 to AA2_E4 and the corner active areas AA2_C1 to AA2_C4 shown in FIG. 1A. In such an embodiment, the number of the edge active areas AA2_E1 to AA2_E4 and the number of the corner active areas AA2_C1 to AA2_C4, which are contained in the second active area AA2, may be variously modified based on a shape of the first active area AA1.

The first to fourth edge active areas AA2_E1 to AA2_E4 may be bent to have first to fourth curvatures, respectively, in the third direction DR3. Each of the first to fourth edge active areas AA2_E1 to AA2_E4 may have a single or constant curvature. The first to fourth edge active areas AA2_E1 to AA2_E4 may have curvatures or radii of curvature that are equal to each other or partially equal to and partially different from each other.

Each of the corner active areas AA2_C1 to AA2_C4 may be bent to have a predetermined curvature in the third direction DR3. Each of the first to fourth corner active areas AA2_C1 to AA2_C4 may have multi-curvatures (e.g., double curvatures). In an embodiment, each of the first to fourth corner active areas AA2_C1 to AA2_C4 may have a single or constant curvature.

Referring to the first corner active area AA2_C1, the first corner active area AA2_C1 may extend from the first active area AA1, the first edge active area AA2_E1, and the third edge active area AA2_E3. In an embodiment, as shown in FIG. 1D, the first corner active area AA2_C1 may have a maximum curvature C-M at an area, which is the most adjacent to the first edge active area AA2_E1 and the third edge active area AA2_E3, (or a boundary between two areas) and a minimum curvature C-L at an area that is the most away from the first edge active area AA2_E1 and the third edge active area AA2_E3. The maximum curvature C-M may be equal to each of a first curvature of the first edge active area AA2_E1 and a third curvature of the third edge active area AA2_E3. The curvature is inversely proportional to the radius of curvature (hereinafter, referred to as a curvature radius).

Figure 2A:
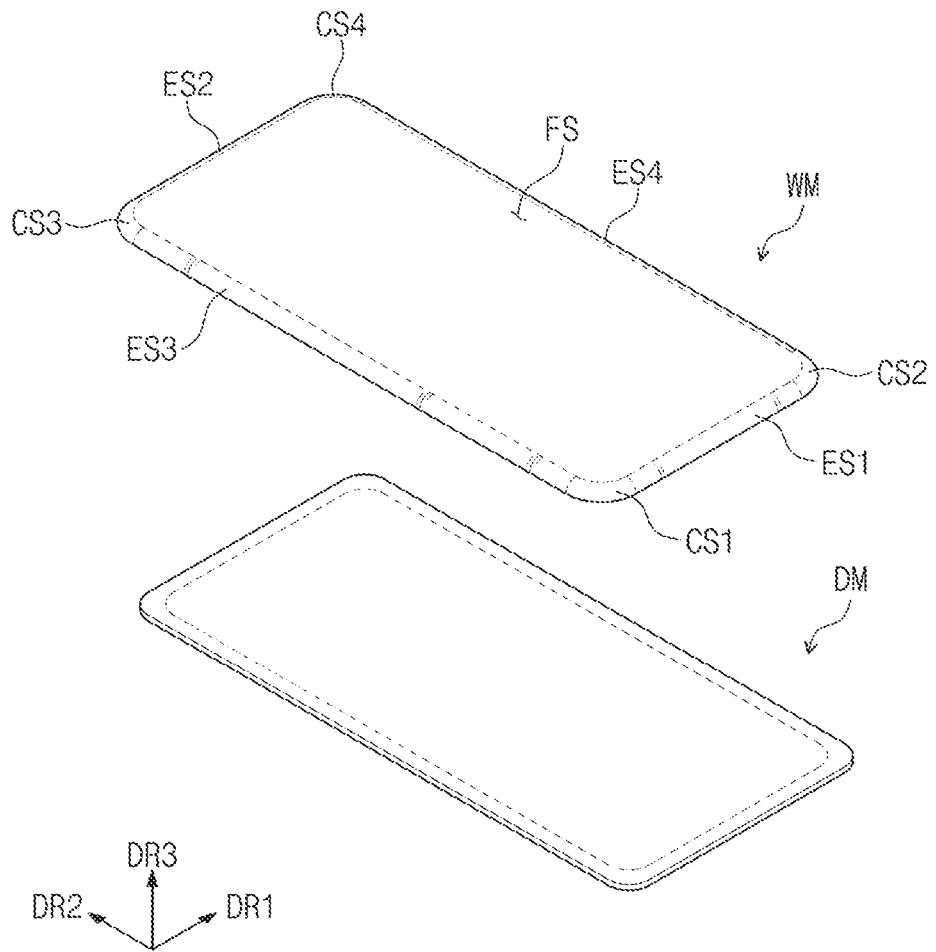
FIG. 2A is an exploded perspective view illustrating the display device according to an embodiment of the invention.
Figure 2B:
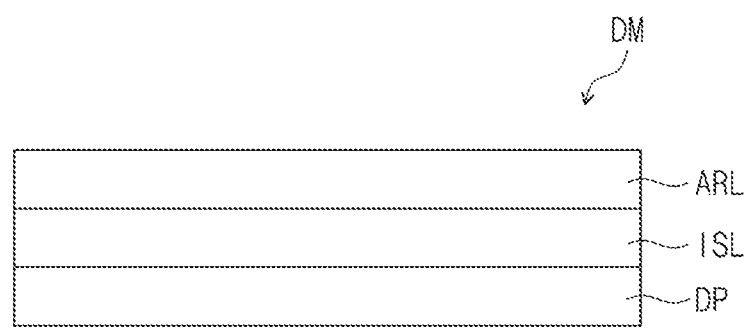
FIG. 2B is a cross-sectional view illustrating a display module according to an embodiment of the invention.
Figure 2C:
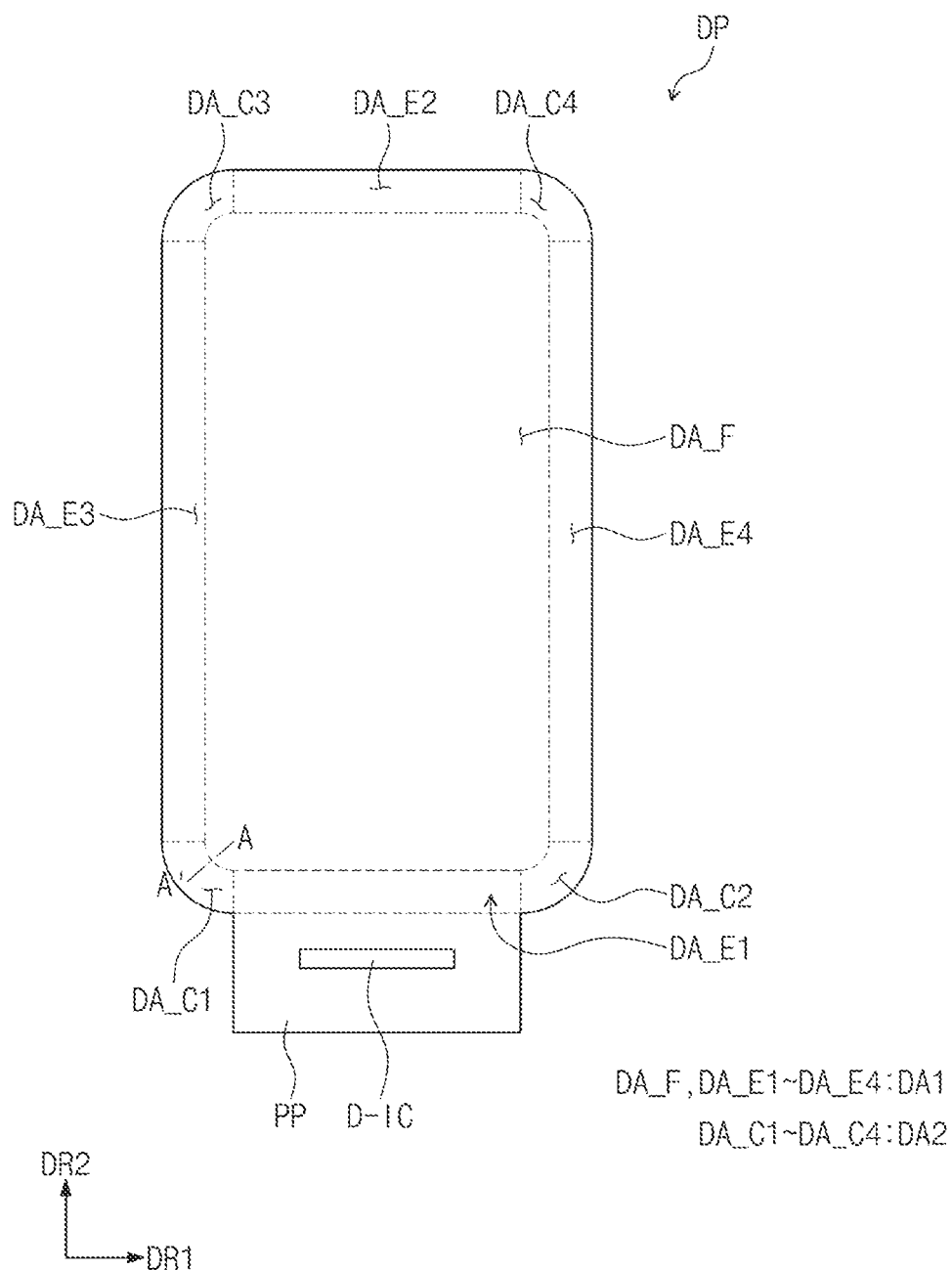
FIG. 2C is a plan view illustrating a display panel according to an embodiment of the invention.
Figure 2D:
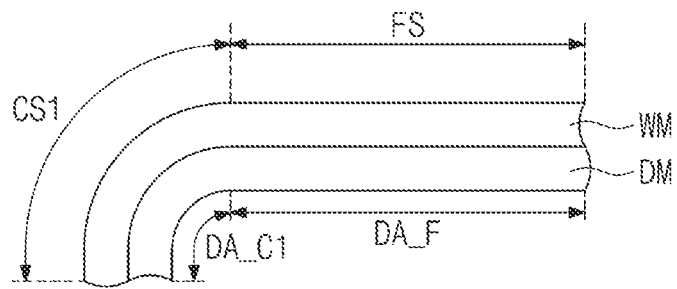
FIG. 2D is a cross-sectional view illustrating the display device according to an embodiment of the invention.

FIG. 2A is an exploded perspective view illustrating the display device DD according to an embodiment of the invention, FIG. 2B is a cross-sectional view illustrating a display module DM according to an embodiment of the invention, and FIG. 2C is a plan view illustrating a display panel DP according to an embodiment of the invention. FIG. 2D is a cross-sectional view illustrating the display device DD according to an embodiment of the invention.

Referring to FIG. 2A, an embodiment of the display device DD includes a window WM and a display module DM. Although not separately shown, the display device DD may further include a support member supporting the display module DM. The support member may include a material having a relatively high stiffness. In one embodiment, for example, the support member may include a glass, a plastic or a metal, or a plurality of frames and/or plates made of a combination thereof.

The window WM is disposed above the display module DM. The window WM may be optically clear. Thus, an image displayed on the display panel DP may be transmitted through the window WM and viewed to a user. That is, a display surface of the display device DD may be defined by the window WM.

The window WM substantially provides or defines an outer surface of the display device DD. The window WM may provide the first active area AA1 and the second active area AA2 described above with reference to FIGS. 1A to 1D.

The window WM may include a base member and a bezel pattern. The base member may include a glass, a plastic or a film, and may have a single-layer or multi-layer structure. The bezel pattern may overlap a partial area of the base member to define the bezel area described above with reference to FIGS. 1A to 1D. In an embodiment, a pattern corresponding to the bezel pattern is disposed on another member of the display device DD, and the bezel pattern of the window WM may be omitted.

The base member of the window WM may include a front area FS, a side area ES1 to ES4 bent from the front area FS, and corner areas CS1 to CS4 adjacent to the side areas ES1 to ES4. The front area FS may correspond to the first active area AA1, the side areas ES1 to ES4 may correspond to the edge active areas AA2_E1 to AA2_E4, and the corner areas CS1 to CS4 may correspond to the corner active areas AA2_C1 to AA2_C4. Herein, an expression "an area corresponds to another area" represents that an area overlaps another area, which is not limited to a case where the areas have a same surface area as each other.

In an embodiment of the invention, the window WM may include four side areas ES1 to ES4, i.e., a first side area ES1, a second side area ES2, a third side area ES3, and a fourth side area ES4, which are bent from four sides of the front area FS. In such an embodiment, the front area FS may be a plane defined by the first direction DR1 and the second direction DR2. Each of the first to fourth side areas ES1 to ES4 may have a same curvature as a corresponding area of the edge active areas AA2_E1 to AA2_E4.

Each of the first side area ES1 and the second side area ES2 is bent from the front area FS. The first and second side areas ES1 and ES2 may be bent from first and second sides, respectively, of the front area FS. The first and second sides of the front area FS may be parallel to the first direction DR1. The first side area ES1 and the second side area ES2 may be disposed parallel to each other in the first direction DR1. The third and fourth side areas ES3 and ES4 may be bent from third and fourth sides, respectively, of the front area FS.

In an embodiment of the invention, the first to fourth side areas ES1 to ES4 may have a same curvature radius as each other. In an embodiment of the invention, the first and second side areas ES1 and ES2 may have a same curvature radius as each other, and the third and fourth side areas ES3 and ES4 may have a same curvature radius as each other. In such an embodiment, each of the first and second side areas ES1 and ES2 may have a curvature radius different from that of each of the third and fourth side areas ES3 and ES4.

Each of the first to fourth corner areas CS1 to CS4 may have at least two curvatures. Each of the first to fourth corner areas CS1 to CS4 may have a shape in which curved surfaces having different curvatures are continuously connected to each other.

In an embodiment, as illustrated in FIG. 2B, the display module DM may include a display panel DP, an input sensing layer ISL disposed on the display panel DP, and an anti-reflection member ARL disposed on the input sensing layer ISL. At least one selected from the display panel DP, the input sensing layer ISL and the anti-reflection member ARL may be provided through a continuous process or may be coupled to each other by using an adhesive member. In an embodiment shown in FIG. 2B, the display module DM may be provided through a continuous process without an adhesive layer. In an embodiment, the adhesive member may be disposed between the display panel DP, the input sensing layer ISL, and the anti-reflection member ARL. In an embodiment, at least one selected from the input sensing layer ISL and the anti-reflection member ARL may be omitted according to the purpose of the display module DM.

The display panel DP generates an image, and the input sensing layer ISL acquires coordinates information of an external input (e.g., a touch event thereon). In an embodiment, the display module DM may further include a protection member (not shown) disposed on a bottom surface of the display panel DP.

In an embodiment, the display panel DP may be a light emitting display panel, but the embodiment of the invention is not particularly limited thereto. In one embodiment, for example, the display panel DP may be an organic light emitting display panel or a quantum-dot light emitting display panel. The organic light emitting display panel may include a light emitting layer containing an organic light emitting material. The quantum dot light emitting display panel may include a light emitting layer containing a quantum dot and a quantum rod. Hereinafter, for convenience of description, embodiments where the display panel DP is the organic light emitting display panel will be described in detail.

The anti-reflection member ARL may reduce reflectance of external light incident from above the window WM. The anti-reflection member ARL according to an embodiment of the invention may include a retarder and a polarizer. The retarder may be a film type or a liquid crystal coating type and include a $\lambda/2$ retarder and/or a $\lambda/4$ retarder. The polarizer may be also a film type or a liquid crystal coating type. The film type may include a flexible synthetic resin film, and the liquid crystal coating type may include liquid crystals arranged in a predetermined arrangement.

The anti-reflection member ARL according to an embodiment of the invention may include color filters. The color filters have a predetermined arrangement. The anti-reflection member ARL may further include a black matrix disposed adjacent the color filters.

Referring to FIGS. 2A to 2D, an embodiment of the display panel DP may include a display area DA1 and DA2 on which a pixel is disposed. In an embodiment of the invention, the display area may include a first display area DA1 (hereinafter, referred to as a first area) and a second display area DA2 (hereinafter, referred to as a second area). Although not separately shown, a non-display area defined along an edge of the display panel DP may be defined in the display panel DP. The non-display area may correspond to the above-described bezel area.

The first area DA1 may include a front display area DAF and first to fourth side display areas DA_E1 to DA_E4. The front display area DA_F corresponds to the front area FS when the display module DM is attached to the window WM. The first to fourth side display areas DA_E1 to DA_E4 correspond to the first to fourth side areas ES1 to ES4, respectively, when the display module DM is attached to the window WM. The second area DA2 may include first to fourth corner display areas DA_C1 to DA_C4. The first to fourth corner display areas DA_C1 to DA_C4 correspond to the first to fourth corner areas CS1 to CS4, respectively, when the display module DM is attached to the window WM.

The display panel DP may further include a third area PP extending from the first side display area DA_E1. In the third area PP, a driving chip D-IC and pads may be disposed. The driving chip D-IC may provide a driving signal to the first and second areas DA1 and DA2 of the display panel DP. The driving chip D-IC may be mounted on the display panel DP. The display panel DP may be electrically connected to a printed circuit board (not shown) through the pads. In an embodiment of the invention, the driving chip D-IC may be mounted on the printed circuit board. The third area PP may be bent to be disposed on a rear surface of the front display area DA_F.

FIG. 2D is a cross-sectional view illustrating the corner active area AA2_C1 in FIG. 1D. In an embodiment, as shown in FIG. 2D, the front display area DA_F is coupled to the front area FS and the first corner display area DA_C1 is coupled to the first corner area CS1. FIG. 2D illustrates an embodiment in a state in which the display module DM is attached to the window WM, and the areas are displayed with reference to the display panel DP.

In an embodiment where the input sensing layer ISL and the anti-reflection member ARL may be disposed to overlap the first area DA1 and the second area DA2, the input sensing layer ISL and the anti-reflection member ARL may overlap only the first area DA1.

Figure 3A:
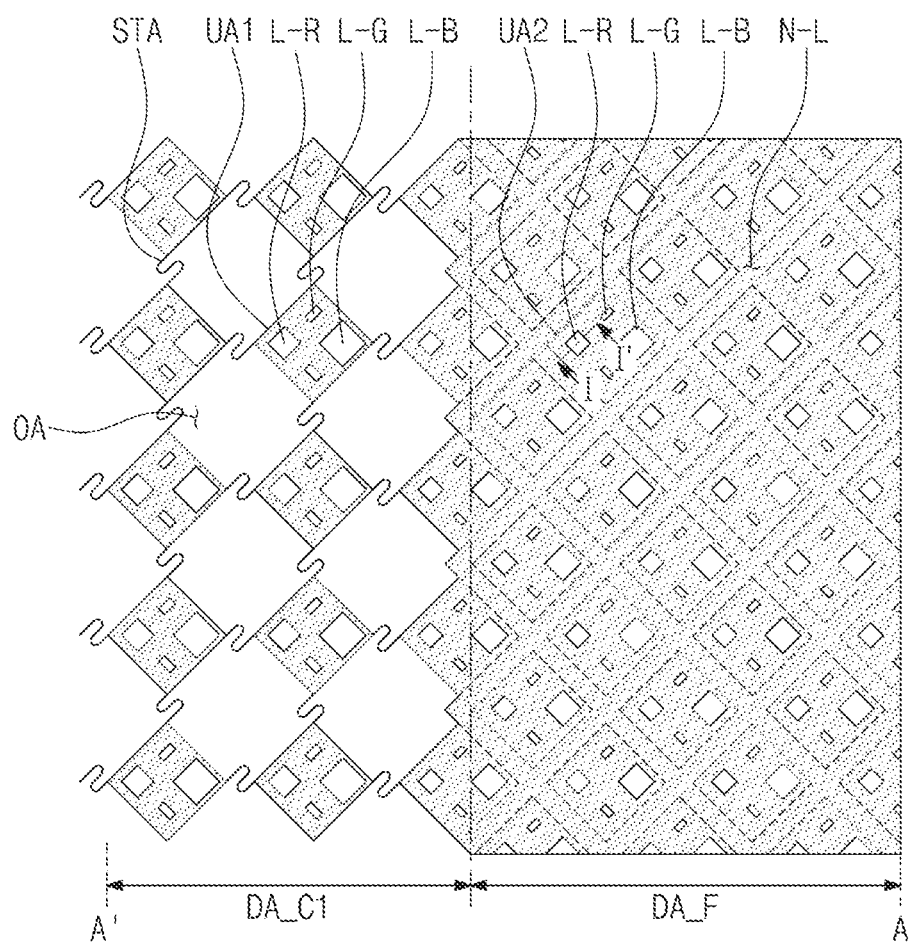
FIG. 3A is an enlarged plan view illustrating a partial area of the display panel according to an embodiment of the invention.
Figure 3B:
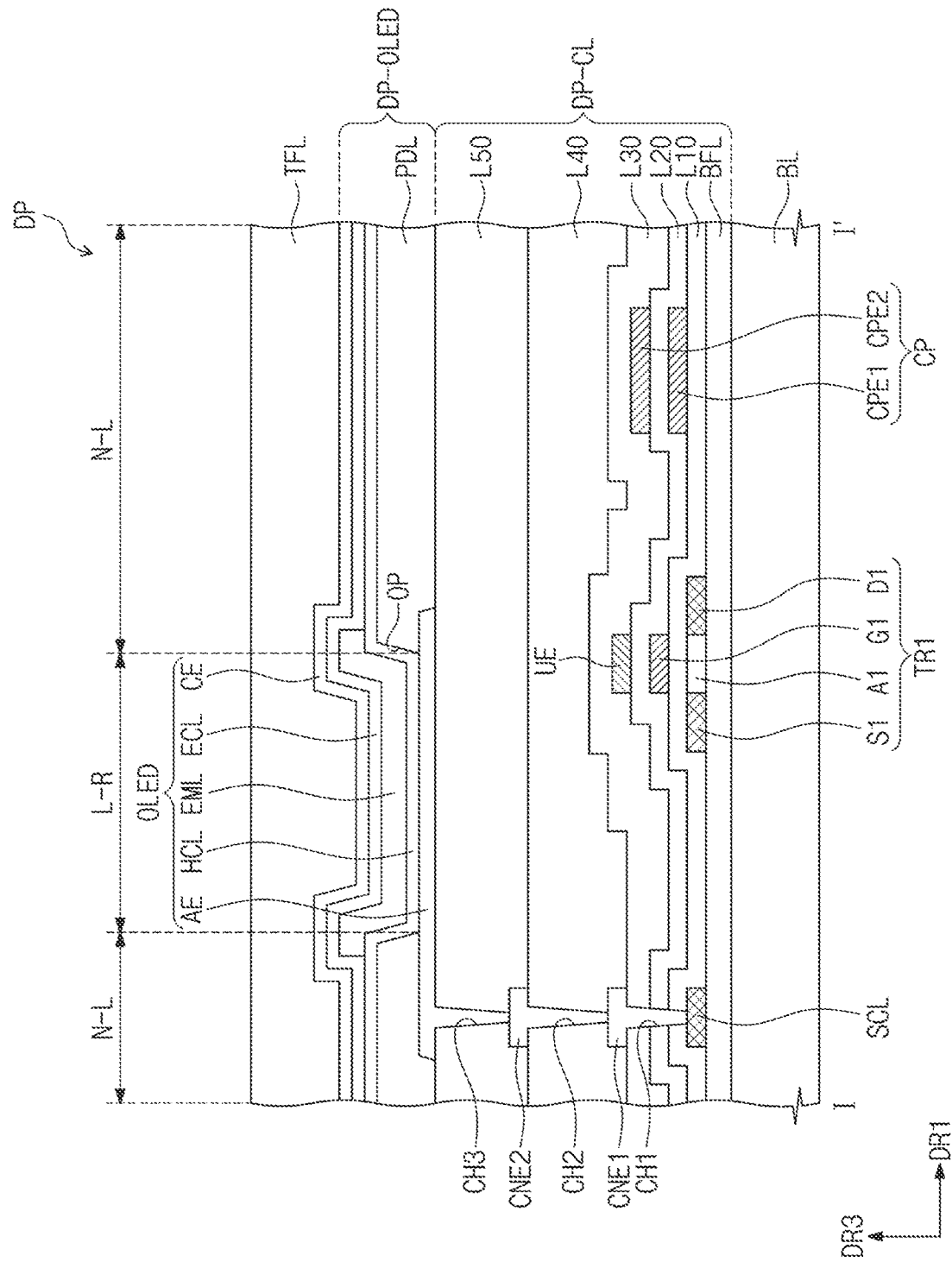
FIG. 3B is a cross-sectional view corresponding to the partial area of FIG. 3A.
Figure 3C:
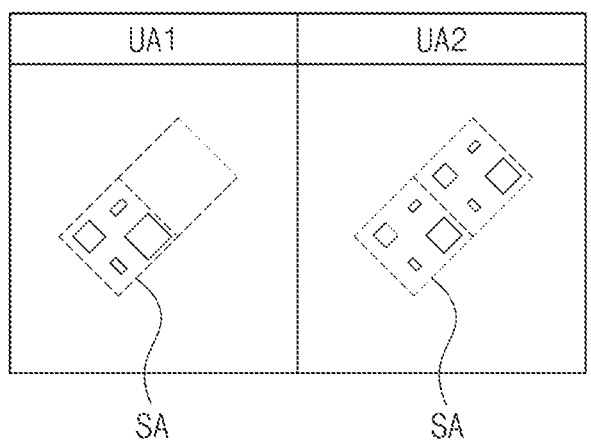
FIG. 3C is a view comparing a pixel density and a light emitting area of a pixel according to an area of the display panel according to an embodiment of the invention.

FIG. 3A is an enlarged plan view illustrating a partial area of the display panel DP according to an embodiment of the invention. FIG. 3B is a cross-sectional view corresponding to the partial area of FIG. 3A. FIG. 3C is a view comparing a pixel density and a light emitting area of a pixel according to an area of the display panel DP according to an embodiment of the invention.

FIG. 3A is an enlarged plan view illustrating an area corresponding to line A'-A of FIG. 2C. FIG. 3A illustrates a portion of each of the first corner display area DA_C1 and the front display area DA_F. Although not separately shown, the second to fourth corner display areas DA_C2 to DA_C4 may have the same pixel configuration, pixel arrangement, and arrangement of light emitting areas as the first corner display area DA_C1 that will be described later, and the first to fourth side display areas DA_E1 to DA_E4 may have the same pixel configuration, pixel arrangement, and arrangement of light emitting areas as the front display area DA_F that will be described later. That is, the first corner display area DA_C1 is described as a representative of the second display area DA2 (refer to FIG. 2C), and the front display area DAF is described as a representative of the first display area DA1 (refer to FIG. 2C).

Three kinds of pixels are disposed on or disposed in each of the first corner display area DA_C1 and the front display area DA_F. The three kinds of pixels that emit light having different colors may be defined as a first color pixel, a second color pixel, and a third color pixel, respectively. Each of the three kinds of pixels may include a pixel driving circuit and a light emitting element.

In FIG. 3A, light emitting areas L-R, L-G, and L-B of the light emitting elements are illustrated. A first light emitting area L-R is a light emitting area of the first color pixel, a second light emitting area L-G is a light emitting area of the second color pixel, and a third light emitting area L-B is a light emitting area of the third color pixel. Hereinafter, the light emitting areas L-R, L-G, and L-B will be described in greater detail with reference to FIG. 3B.

FIG. 3B illustrates a cross-section of the display panel DP corresponding to the first light emitting area L-R of the light emitting areas L-R, L-G, and L-B. FIG. 3B illustrates a cross-section of one transistor TR1 constituting the pixel driving circuit and an organic light emitting diode OLED corresponding to the light emitting element.

In an embodiment, as shown in FIG. 3B, the transistor TR1 and the organic light emitting diode OLED are disposed on a base layer BL. The base layer BL may include a synthetic resin layer. A circuit element layer DP-CL is disposed on the base layer BL.

In such embodiment, the circuit element layer DP-CL may include a buffer layer BFL, a first intermediate inorganic layer L10, a second intermediate inorganic layer L20 and a third intermediate inorganic layer L30, which are inorganic layers, and further include a first intermediate organic layer L40 and a second intermediate organic layer L50, which are organic layers.

A semiconductor pattern is disposed on the buffer layer BFL. The semiconductor pattern may include a silicon semiconductor. A first semiconductor pattern may include polysilicon. However, the embodiment of the invention is not limited thereto. In one embodiment, for example, the first semiconductor pattern may include amorphous silicon. In one embodiment, for example, the semiconductor pattern may include a metal oxide semiconductor.

The semiconductor pattern has an electrical property that is different or changed based on doping. The semiconductor pattern may include a doped area and a non-doped area. The doped area may be doped with an n-type dopant or a p-type dopant. A p-type transistor includes a doped area that is doped with the p-type dopant.

The doped area has a conductivity greater than that of a non-doped area and substantially serves as an electrode or a signal line. The non-doped area substantially corresponds to an active (or a channel) of the transistor. In such an embodiment, one portion of the semiconductor pattern may be the active (or the channel) of the transistor, another portion may be a source (or an input electrode region) or a drain (or an output electrode region) of the transistor, and another portion may be a conductive part (or a conductive region).

In an embodiment, as illustrated in FIG. 3B, a source S1, an active A1, and a drain D1 of the transistor TR1 may be provided from or defined by portions of the semiconductor pattern. A portion of a conductive part SCL provided from the semiconductor pattern is illustrated. Although not separately shown, the conductive part SCL may be connected to another transistor (e.g., a driving transistor) constituting the pixel driving circuit on a plane.

A control electrode G1 is disposed on the first intermediate inorganic layer L10 to overlap the active A1. A first capacitor electrode CPE1 of a capacitor CP is disposed on the first intermediate inorganic layer L10. A second capacitor electrode CPE2 of the capacitor CP is disposed on the second intermediate inorganic layer L20. An upper electrode UE overlapping the control electrode G1 is disposed on the second intermediate inorganic layer L20.

A first connection electrode CNE1 may be disposed on the third intermediate inorganic layer L30. The first connection electrode CNE1 may be connected to the conductive part SCL through a first through-hole CH1. A second connection electrode CNE2 may be disposed on the first intermediate organic layer L40. The second connection electrode CNE2 may be connected to the first connection electrode CNE1 through a second through-hole CH2. Although not shown, conductive patterns different from the first connection electrode CNE1 may be disposed on the third intermediate inorganic layer L30, and conductive patterns different from the second connection electrode CNE2 may be disposed on the first intermediate organic layer L40. The above-described conductive patterns may constitute a signal line (e.g., a data line).

A first electrode AE is disposed on the second intermediate organic layer L50. The first electrode AE may be connected to the second connection electrode CNE2 through a third through-hole CH3. A light emitting opening OP is defined in a pixel defining layer PDL. The light emitting opening OP of the pixel defining layer PDL exposes at least a portion of the first electrode AE. In an embodiment, the pixel defining layer PDL and the organic light emitting diode OLED may be collectively referred to as a light emitting layer DP-OLED.

The first area DA1 may include a first light emitting area L-R and a non-light emitting area N-L disposed adjacent to the first light emitting area L-R. The non-light emitting area N-L may surround the first light emitting area L-R. In such an embodiment, the first light emitting area L-R is defined in correspondence to a partial area of the first electrode AE, which is exposed by the light emitting opening OP.

A hole control layer HCL may be disposed in the first light emitting area L-R and the non-light emitting area N-L in common. The hole control layer HCL may include a hole transport layer and further include a hole injection layer. A light emitting layer EML is disposed on the hole control layer HCL. The light emitting layer EML may be disposed on an area corresponding to the light emitting opening OP. In such an embodiment, the light emitting layer EML may be separately provided in each of the pixels. The light emitting layer EML may include an organic material and/or an inorganic material. The light emitting layer EML may generate colored light having a predetermined color.

An electron control layer ECL is disposed on the light emitting layer EML. The electron control layer ECL may include an electron transport layer and further include an electron injection layer. The hole control layer HCL and the electron control layer ECL may be provided in common to the plurality of pixels by using an open mask. A second electrode CE is disposed on the electron control layer ECL. The second electrode CE is disposed in common to the plurality of pixels. An upper insulation layer TFL is disposed on the second electrode CE. The upper insulation layer TFL may have a multilayer structure including a plurality of thin-films. The plurality of thin-films may include an organic film and/or an inorganic film.

The first corner display area DA_C1 and the front display area DA_F will be described in greater detail with reference back to FIG. 3A. The first corner display area DA_C1 includes a plurality of first unit areas UA1. The plurality of first unit areas UA1 have a same arrangement of light emitting areas as each other. The plurality of first unit areas UA1 includes the first light emitting area L-R, the second light emitting area L-G, and the third light emitting area L-B. In such an embodiment, each of the plurality of first unit areas UA1 includes one first light emitting area L-R, two second light emitting areas L-G, and one third light emitting area L-B. The two second light emitting areas L-G face each other, and the first light emitting area L-R faces the third light emitting area L-B.

One of the two second light emitting areas L-G may be defined as a fourth light emitting area that is distinguished from the second light emitting area L-G. In one embodiment, for example, the second light emitting area L-G and the fourth light emitting area may have different planar shapes from each other. However, the number and kind of the light emitting areas contained in the plurality of first unit areas UA1 in the embodiment of the invention is not limited thereto.

In an embodiment, the one first light emitting area L-R, which is a first color light emitting area, may generate red light. Each of the two second light emitting areas L-G, which is a second color light emitting area, may generate green light. The one third light emitting area L-B, which is a third color light emitting area, may generate blue light. The red light, the green light, and the blue light may be changed into light having other three primary colors.

At least a partial area of the first corner display area DA_C1 includes a plurality of opening areas OA defined through the display panel DP in FIG. 3B. In an embodiment, as shown in FIG. 3A, the plurality of opening areas OA may be uniformly defined over the entire first corner display area DA_C1.

The first unit areas UA1 and the plurality of opening areas OA are disposed alternately along a fourth direction DR4 and disposed alternately along a fifth direction DR5. The fourth direction DR4 may correspond to the first direction DR1 of FIG. 2C or the fourth direction DR4 may be defined as a direction having a predetermined angle with respect to the first direction DR1.

The first corner display area DA_C1 includes a plurality of stretchable areas STA disposed between the plurality of first unit areas UA1. The plurality of opening areas OA are provided so that the plurality of first unit areas UA1 are connected by the plurality of stretchable areas STA. Thus, the plurality of opening areas OA are disposed adjacent to the plurality of first unit areas UA1 and the plurality of stretchable areas STA.

In an embodiment, as illustrated in FIG. 3A, at least a portion of each of the plurality of stretchable areas STA may have a curved line shape. In an embodiment, as shown in FIG. 3A, four stretchable areas STA are provided in or connected to one first unit area UA1 in the first corner display area DA_C1. The number and shape of the stretchable areas STA connected to the one first unit area UA1 may be changed.

Although not separately shown, the stretchable area STA may have the substantially same cross-section as that of the non-light emitting area N-L in FIG. 3B. However, the stretchable area STA may include only signal lines electrically connecting the first unit areas UA1 and thus have a different laminated structure of the conductive pattern and the insulation layer from the non-light emitting area N-L.

In an embodiment, the plurality of stretchable areas STA may be stretched in a process of attaching the display module DM to the window WM in FIG. 2A. In such an embodiment, referring to FIGS. 2C and 2D, since the plurality of stretchable areas STA are stretched when the first corner display area DA_C1 is attached to the first corner area CS1, the first corner display area DA_C1 may be closely attached to the first corner area CS1 although the first corner area CS1 has multi-curvatures.

In an embodiment, as shown in FIG. 3A, the front display area DA_F includes a plurality of second unit areas UA2. The plurality of second unit areas UA2 have a same arrangement of light emitting areas as each other. The plurality of second unit areas UA2 include the first light emitting area L-R, the second light emitting area L-G, and the third light emitting area L-B. In such an embodiment, each of the plurality of second unit areas UA2 may have the same number and arrangement of light emitting areas as those of each of the plurality of first unit areas UA1. Each of the plurality of second unit areas UA2 may include one first light emitting area L-R, two second light emitting areas L-G, and one third light emitting area L-B. The second unit area UA2 may have the same area as the first unit area UA1.

The plurality of opening areas OA are not defined in the front display area DA_F unlike the first corner display area DA_C1. Thus, the front display area DA_F has a density of light emitting area, i.e., the number of light emitting areas per a predetermined unit area, greater than that of the first corner display area DA_C1. The predetermined unit area may be set to be greater by two times or three times than an area of each of the first and second unit areas UA1 and UA2.

Since the first corner display area DA_C1 has the number of the light emitting areas per the unit area less than that of the front display area DA_F, the first corner display area DA_C1 has brightness per the unit area less than that of the front display area DAF when the same light emitting area and the same driving condition are provided. The same light emitting area represents that light emitting areas corresponding to the first unit area UA1 and the second unit area UA2 have the same area as each other. The same driving condition represents that the same driving voltage is applied to the light emitting element.

According to an embodiment, each of the first, second, and third light emitting areas L-R, L-G, and L-B of the first corner display area DA_C1 has an area greater than that of a corresponding light emitting area of the first, second, and third light emitting areas L-R, L-G, and L-B of the front display area DAF to compensate a brightness difference between the first corner display area DA_C1 and the front display area DA_F. In an embodiment where the light emitting areas between corresponding light emitting elements are different from each other, and the same driving voltage is applied to corresponding light emitting elements, a brightness ratio between the corresponding light emitting elements is proportional to a light emitting area ratio.

In an embodiment, as shown in FIG. 3C, a predetermined unit area SA may have an area two times greater than each of the first and second unit areas UA1 and UA2. In such an embodiment, the density (i.e., the number of the light emitting areas per the predetermined unit area SA) of the second unit areas UA2 in the front display area DA_F is two times greater than that of the first unit areas UA1 in the first corner display area DA_C1.

In such an embodiment, the first light emitting area L-R of the first corner display area DA_C1 has an area two times greater than the first light emitting area L-R of the front display area DA_F, the second light emitting area L-G of the first corner display area DA_C1 has an area two times greater than the second light emitting area L-G of the front display area DA_F, and the third light emitting area L-B of the first corner display area DA_C1 has an area two times greater than the third light emitting area L-B of the front display area DA_F. As a result, in such an embodiment, the front display area DAF and the first corner display area DA_C1 may have a substantially same light emitting area per the unit area SA as each other.

In such an embodiment, a life time of the light emitting element may be deduced based on mathematical equation 1 below.

$$T1 = T0(L0/L1)^{acc} \qquad \text{[Mathematical equation 1]}$$

When initial brightness is L0 and L1, a life time is T0 and T1, respectively. A superscript acc is an acceleration factor that is affected by a temperature, an element property, and a material property. In an embodiment, the superscript acc may be about 1.8. It will be described by assuming the life time T0 is about 1000 hours (hr) when the initial brightness L0 of the light emitting area is about 100 candela per square meter ($cd/m^2$).

In an embodiment of the invention, the life time T1 of the light emitting element of the front display area DA_F may be about 55 hr when the initial brightness L1 of the light emitting area of the front display area DA_F is about 500 $cd/m^2$. The area (with respect to four light emitting areas) of the entire light emitting areas per the unit area SA of the first corner display area DA_C1 increases in correspondence to the area (with respect to eight light emitting areas) of light emitting areas per the unit area SA of the front display area DAF by increasing the area of the light emitting area corresponding to the first corner display area DA_C1.

When the initial brightness L1 of the light emitting area of the first corner display area DA_C1 is about 500 $cd/m^2$, the brightness per the unit area of the first corner display area DA_C1 may be sufficiently coincided with that of the front display area DA_F. Thus, the expected life time T1 of the light emitting element of the first corner display area DA_C1 may be substantially the same as that of the light emitting element of the front display area DA_F.

In an embodiment of the invention, each of the light emitting areas L-R, L-G, and L-B of the first corner display area DA_C1 may have an area greater by about 1.5 times than that of a corresponding light emitting area of the light emitting areas L-R, L-G, and L-B of the front display area DA_F. The initial brightness L1 of each of the light emitting areas L-R, L-G, and L-B of the first corner display area DA_C1 increases so that the initial brightness (with respect to four light emitting areas) per the unit area SA of the first corner display area DA_C1 increases in correspondence to the initial brightness (with respect to eight light emitting areas) per the unit area SA of the front display area DA_F. That is, the driving voltage of the light emitting element of the first corner display area DA_C1 may be desired to increase. When the initial brightness L1 of each of the light emitting areas L-R, L-G, and L-B of the first corner display area DA_C1 is about 667 cd/m$^2$, the initial brightness per the unit area SA of the first corner display area DA_C1 may correspond to that of the front display area DA_F. Here, the expected life time T1 of the light emitting element of the first corner display area DA_C1 is about 33 hr.

In a comparative example, each of the light emitting areas L-R, L-G, and L-B of the first corner display area DA_C1 may have the same area as a corresponding light emitting area of the light emitting areas L-R, L-G, and L-B of the front display area DA_F. The initial brightness L1 of each of the light emitting areas L-R, L-G, and L-B of the first corner display area DA_C1 is desired to increase up to about 1000 cd/m$^2$ so that the initial brightness (with respect to four light emitting areas) per the unit area SA of the first corner display area DA_C1 increases in correspondence to the initial brightness (with respect to eight light emitting areas) per the unit area SA of the front display area DA_F. Here, the expected life time T1 of the light emitting element of the first corner display area DA_C1 is about 15 hr.

In an embodiment, when compared with the comparative example, as the light emitting area of the first corner display area DA_C1 increases, the life time of the light emitting element may increase, and the brightness difference between the first corner display area DA_C1 and the front display area DAF may decrease.

Figure 4A:
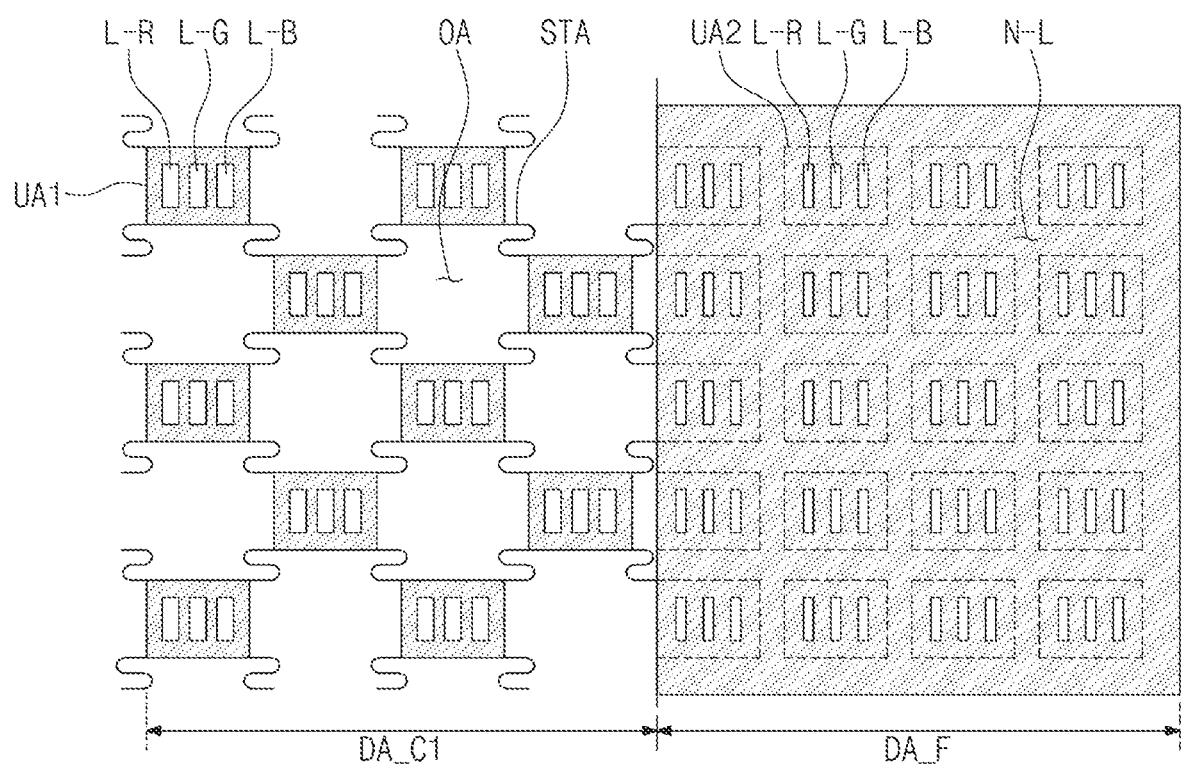
FIGS. 4A to 4D are enlarged plan views illustrating a partial area of the display panel according to an embodiments of the invention.

FIGS. 4A to 4D are enlarged plan views illustrating a partial area of a display panel DP according to embodiments of the invention. FIG. 5 is an enlarged plan view illustrating a partial area of a display panel DP according to an embodiment of the invention. FIGS. 4A to 5 illustrate embodiments of the display panel DP substantially the same as an embodiment of the display panel DP in FIG. 3A to 3C except for a first unit area UA1 and a second unit area UA2. The same or like elements shown in FIGS. 4A to 5 have been labeled with the same reference characters as used above to describe the embodiment of the display panel DP shown in FIGS. 3A to 3C, and any repetitive detailed description thereof will hereinafter be omitted or simplified.

In an embodiment, as illustrated in FIG. 4A, each of the first unit area UA1 and the second unit area UA2 may include one first light emitting area L-R, one second light emitting area L-G, and one third light emitting area L-B. The first light emitting area L-R, the second light emitting area L-G, and the third light emitting area L-B of each of the first unit area UA1 and the second unit area UA2 may have a stripe type arrangement. The first light emitting area L-R, the second light emitting area L-G, and the third light emitting area L-B of the first unit area UA1 may have the same area as each other, and the first light emitting area L-R, the second light emitting area L-G, and the third light emitting area L-B of the second unit area UA2 may have a same area as each other.

Each of the first, second, and third light emitting areas L-R, L-G, and L-B of the first unit area UA1 may have an area greater than that of a corresponding light emitting area of the first, second, and third light emitting areas L-R, L-G, and L-B of the second unit area UA2 to compensate the brightness difference between the first corner display area DA_C1 and the front display area DA_F.

Figure 4B:
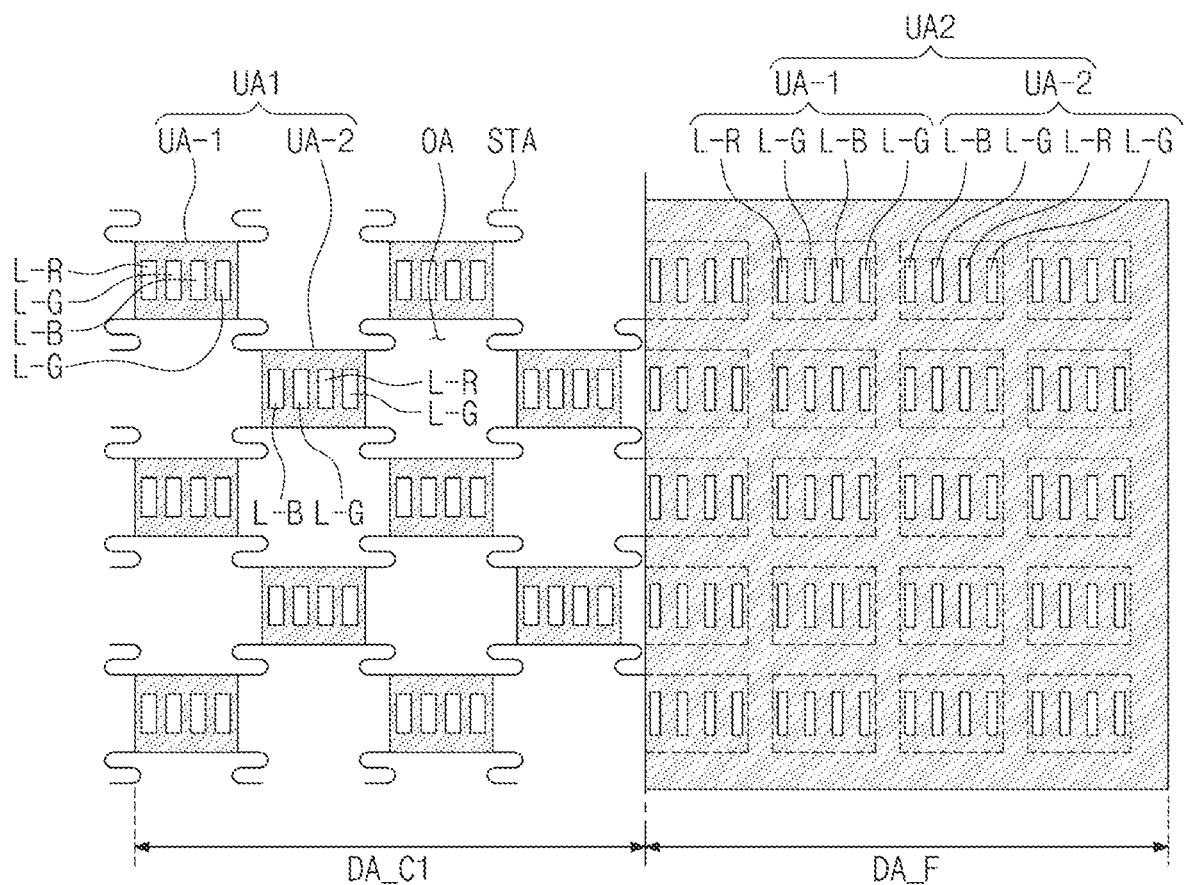
Figure 5:
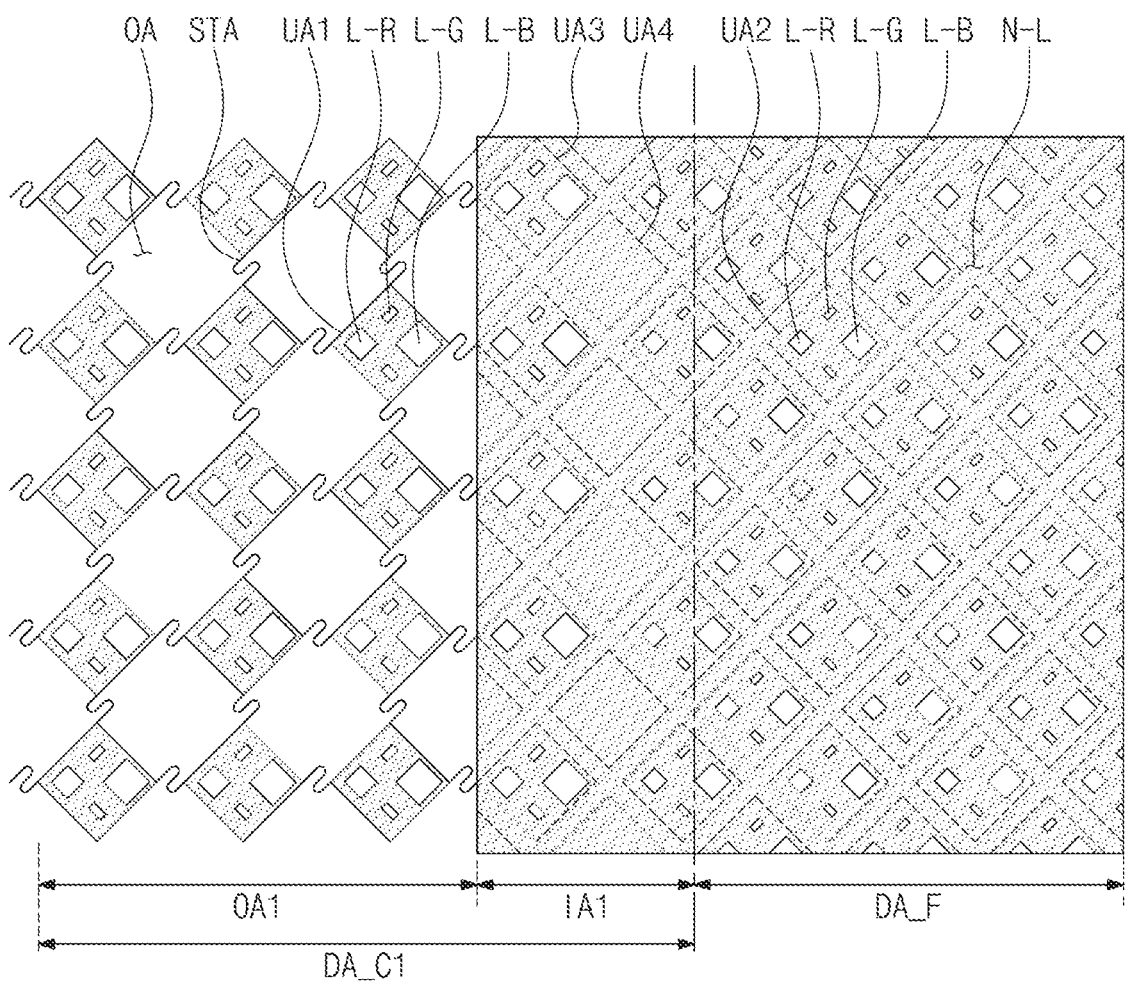
FIG. 5 is an enlarged plan view illustrating a partial area of a display panel according to another an embodiment of the invention.

In an embodiment, as illustrated in FIG. 4B, each of the first unit area UA1 and the second unit area UA2 may include one first light emitting area L-R, two second light emitting areas L-G, and one third light emitting area L-B. The first light emitting area L-R, the second light emitting area L-G, and the third light emitting area L-B of each of the first unit area UA1 and the second unit area UA2 may have a pentile type arrangement.

Each of the first unit area UA1 and the second unit area UA2 may be divided into two groups UA-1 and UA-2 having different arrangements of the one first light emitting area L-R, the two second light emitting areas L-G, and the one third light emitting area L-B. A first group UA-1 of each of the first unit area UA1 and the second unit area UA2 has an arrangement in which the first light emitting area L-R, the second light emitting areas L-G, the third light emitting area L-B, and the second light emitting areas L-G are sequentially arranged in one direction, and a second group UA-2 of each of the first unit area UA1 and the second unit area UA2 has an arrangement in which the third light emitting area L-B, the second light emitting areas L-G, the first light emitting area L-R, and the second light emitting areas L-G are sequentially arranged in one direction.

The first group UA-1 of the first unit area UA1 and the second group UA-2 of the first unit area UA1 may define different rows or different columns in the first corner display area DA_C1. The first group UA-1 of the first unit area UA1 and the second group UA-2 of the first unit area UA1 may be disposed alternately in the same row or the same column in the front display area DA_F.

In an embodiment of the invention, the first light emitting area L-R, the second light emitting area L-G, and the third light emitting area L-B of the first unit area UA1 may have different areas from each other. In such an embodiment, the first light emitting area L-R, the second light emitting area L-G, and the third light emitting area L-B of the second unit area UA2 may have different areas from each other.

In such an embodiment, each of the first, second, and third light emitting areas L-R, L-G, and L-B of the first unit area UA1 may have an area greater than that of a corresponding light emitting area of the first, second, and third light emitting areas L-R, L-G, and L-B of the second unit area UA2 to compensate the brightness difference between the first corner display area DA_C1 and the front display area DA_F.

Although not separately shown, one of the two second light emitting areas L-G of each of the first unit area UA1 and the second unit area UA2 may be replaced by a fourth light emitting area that generates light having a color different from the second light emitting area L-G. In one embodiment, for example, the fourth light emitting area may generate white light.

Figure 4C:
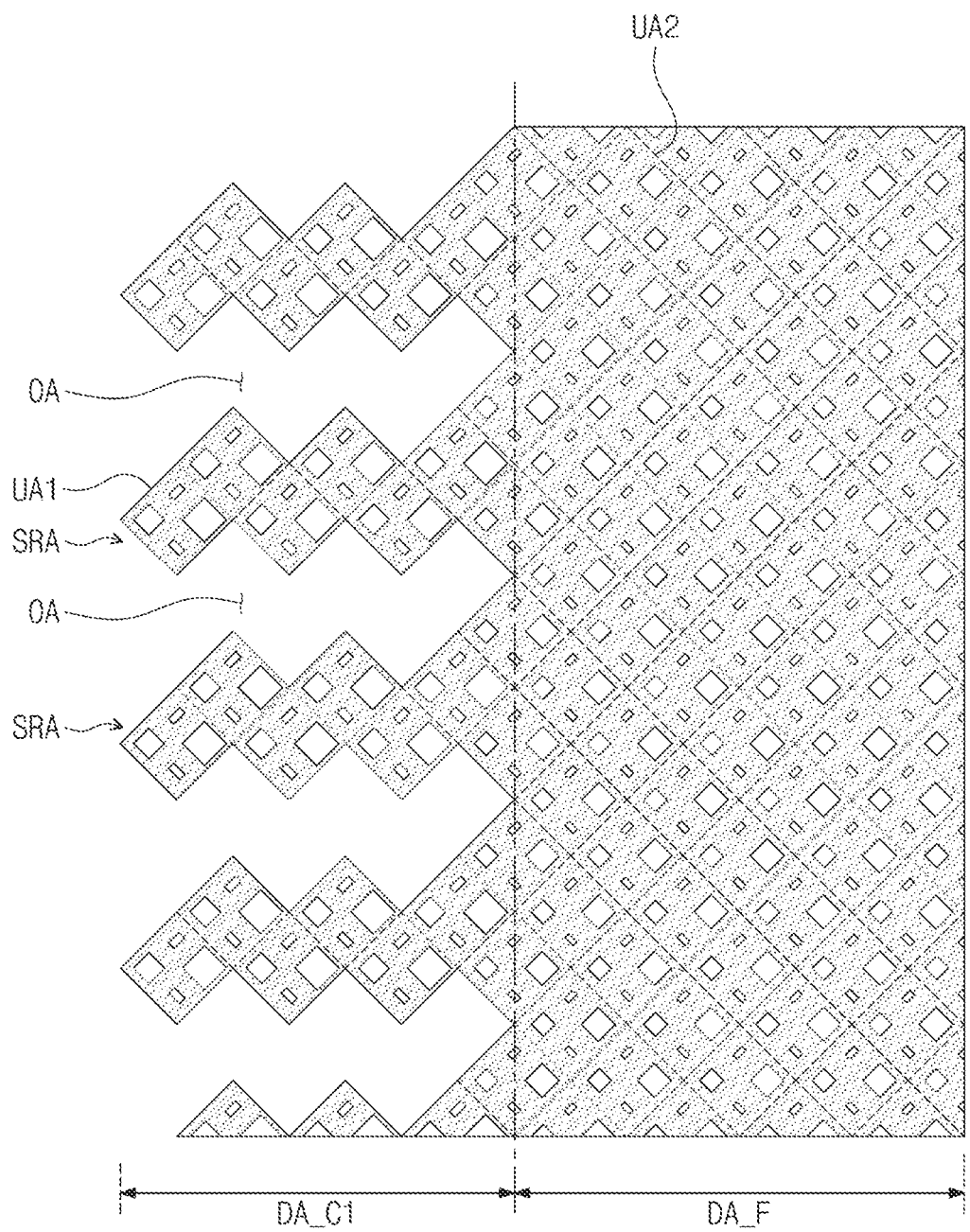
Figure 4D:
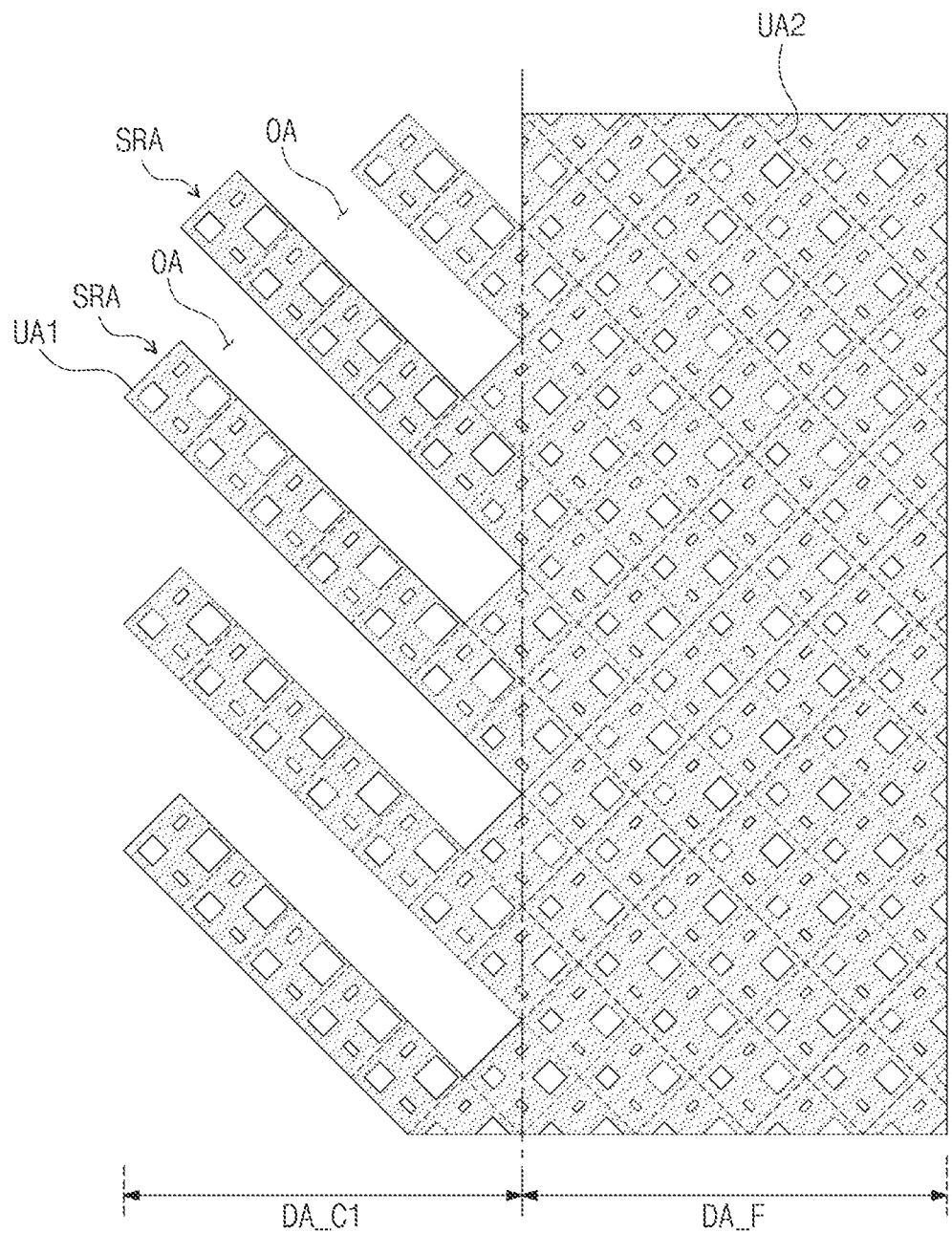

In an embodiment, as illustrated in FIGS. 4C and 4D, a plurality of stripe areas SRA are defined in the first corner display area DA_C1. Each of the plurality of stripe areas SRA includes a plurality of first unit areas UA1. Each of the plurality of stripe areas SRA extends in one direction. Here, the plurality of opening areas OA and the plurality of stripe areas SRA are alternately disposed in a direction crossing an extension direction of the plurality of stripe areas SRA.

In an embodiment, as illustrated in FIGS. 4C and 4D, the stretchable areas STA (refer to FIG. 3A) may be omitted from the first corner display area DA_C1. The plurality of stripe areas SRA having an increased degree of freedom by the plurality of opening areas OA may be attached to the window WM (refer to FIG. 2A) without defects in the corner areas CS1 to CS4 (refer to FIG. 2A).

In another embodiment, as illustrated in FIG. 5, the first corner display area DA_C1 may include an inside area IA1 and an outside area OA1. The inside area IA1 may be disposed closer to the front display area DA_F than the outside area OA1. In such an embodiment, the outside area OA1 is substantially the same as the first corner display area DA_C1 described in FIG. 3A.

The inside area IA1 includes two groups of unit areas that are distinguished from each other. In an embodiment, as shown in FIG. 5, the two groups of unit areas include a third unit area UA3 and a fourth unit area UA4. In such an embodiment, the third unit area UA3 is the same as the first unit area UA1. The third unit area UA3 may have an area of a light emitting area corresponding to the same pixel arrangement and arrangement of the light emitting area as the first unit area UA1. The fourth unit area UA4 has an area corresponding to that of the third unit area UA3. However, light emitting areas are not disposed on the fourth unit area UA4 unlike the third unit area UA3. In such an embodiment, the stretchable area STA described in FIG. 3A is not disposed on the inside area IA1.

The inside area IA1, on which the driving circuit is disposed, has reduced pixel density. Transistors of a driving circuit of the third unit area UA3 may be provided in the same type as the transistor TR1 described with reference to FIG. 3B, and the driving circuit may also include the transistor having the same laminated structure as the transistor TR1. In such an embodiment, the inside area IA1 has a low pixel density, such that the inside area IA1 may secure an area on which the driving circuit is disposed.

According to an embodiment of the invention, the image may be displayed even on the corner area having the multi-curvatures. In such an embodiment, since a portion of the display panel is stretched and then attached to the corner area of the window, the display panel may be effectively prevented from being damaged.

In such an embodiment, the portion of the display panel corresponding to the corner area of the window has the lower pixel density than that of the portion of the display panel corresponding to the front area of the window. In such an embodiment, the portion of the display panel corresponding to the corner area of the window has the greater light emitting area than that of the portion of the display panel corresponding to the front area of the window. In such an embodiment, the increased area of the light emitting area may compensate reduction in brightness due to the lower pixel density.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
a window comprising a front area, a first side area bent from a first side of the front area and having a first curvature, a second side area bent from a second side of the front area and having a second curvature, and a corner area disposed between the first side area and the second side area; and
a display panel coupled to the window,
wherein the display panel comprises:
a first area corresponding to the front area, the first side area, and the second side area of the window, wherein first, second, and third light emitting areas emitting first, second, and third colors respectively are disposed in the first area; and
a second area corresponding to the corner area of the window,
wherein at least a partial area of the second area comprises:
a plurality of first unit areas, wherein a fourth, fifth, and sixth light emitting areas emitting the first, second, and third colors respectively are disposed in each of the plurality of first unit areas; and
a plurality of stretchable areas disposed between the plurality of first unit areas,
wherein a plurality of opening areas are defined through the display panel to be adjacent to the plurality of first unit areas and the plurality of stretchable areas, and
wherein each of the fourth, fifth, and sixth light emitting areas of the second area has an area greater than an area of a corresponding same-color light emitting area of the first, second, and third light emitting areas of the first area.

2. The display device of claim 1, wherein
the first area includes a plurality of second unit areas,
the first, second, and third light emitting areas are disposed in each of the plurality of second unit areas, and
the fourth, fifth, and sixth light emitting areas in each of the plurality of first unit areas have a same arrangement as the first, second, and third light emitting areas in each of the plurality of second unit areas.

3. The display device of claim 1, wherein
the plurality of first unit areas and the plurality of opening areas are alternately disposed in a first direction, and
the plurality of first unit areas and the plurality of opening areas are alternately disposed in a second direction crossing the first direction.

4. The display device of claim 1, wherein
the plurality of first unit areas defines a plurality of stripe areas,
each of the plurality of stripe areas comprises corresponding first unit areas of the plurality of first unit areas,
each of the plurality of stripe areas expends along a first direction, and
the plurality of stripe areas and the plurality of opening areas are alternately disposed in a second direction crossing the first direction.

5. The display device of claim 1, wherein the corner area has a plurality of curvatures.

6. The display device of claim 5, wherein a minimum curvature of the plurality of curvatures of the corner area is less than each of the first curvature and the second curvature.

7. The display device of claim 1, wherein each of the plurality of first unit areas further comprises a seventh light emitting area.

8. The display device of claim 7, wherein
the first area further comprises a eighth light emitting area,
the first area includes a plurality of second unit areas,
the first, second, third, and eighth light emitting areas are disposed in each of the plurality of second unit areas, and
the fourth, fifth, sixth, and seventh emitting areas in each of the plurality of first unit areas have a same arrangement as the first, second, third, and eighth light emitting areas in each of the plurality of second unit areas.

9. The display device of claim 7, wherein two light emitting areas of the fourth, fifth, sixth, and seventh light emitting areas of each of the plurality of first unit areas generate light having a same color as each other.

10. The display device of claim 1, wherein at least a portion of each of the stretchable areas has a curved line shape.

11. The display device of claim 1, wherein
the partial area of the second area is defined as an outside area, and
the second area further comprises an inside area disposed adjacent to the outside area,
wherein the inside area comprises:
a plurality of third unit areas, wherein the fourth, fifth, and sixth light emitting areas are disposed in each of the plurality of third unit areas; and
a plurality of fourth unit areas disposed adjacent to the plurality of third unit areas,
wherein the fourth, fifth, and sixth light emitting areas are not disposed in each of the plurality of fourth unit areas,
each of the fourth unit areas has an area corresponding to each of the third unit areas.

12. A display device comprising:
a window comprising a front area, a first side area bent from a first side of the front area and having a first curvature, a second side area bent from a second side of the front area and having a second curvature, and a corner area disposed between the first side area and the second side area; and
a display panel coupled to the window,
wherein the display panel comprises:
a first area corresponding to the front area, the first side area, and the second side area, wherein first, second, and third light emitting areas emitting a first, second, and third colors respectively are disposed in the first area; and
a second area corresponding to the corner area, wherein a fourth, fifth, and sixth light emitting areas emitting the first, second, and third colors respectively are disposed in the second area,
wherein a number of the first, second, and third light emitting areas per a unit area in the first area is greater than a number of the fourth, fifth, and sixth light emitting areas per the unit area in the second area, and
each of the fourth, fifth, and sixth light emitting areas of the second area has an area greater than an area of a corresponding same-color light emitting area of the first, second, and third light emitting areas of the first area.

13. The display device of claim 12, wherein a plurality of opening areas is defined through the display panel in the second area.

14. The display device of claim 13, wherein the second area comprises:
a plurality of first unit areas, wherein the fourth, fifth, and sixth light emitting areas are disposed in each of the plurality of first unit areas; and
a plurality of stretchable areas disposed between the plurality of first unit areas and disposed adjacent to the plurality of opening areas.

15. The display device of claim 13, wherein
the second area comprises a plurality of first unit areas, wherein the fourth, fifth, and sixth light emitting areas are disposed in each of the plurality of first unit areas,
the plurality of first unit areas defines a plurality of stripe areas,
each of the plurality of stripe areas comprise corresponding first unit areas of the plurality of first unit areas,
each of the plurality of stripe areas expends along a first direction, and
the plurality of stripe areas and the plurality of opening areas are alternately disposed in a second direction crossing the first direction.

16. A display panel comprising:
a first area wherein, the first area includes a plurality of second unit areas in which first, second, and third light emitting areas are disposed; and
a second area disposed adjacent to the first area, wherein at least a partial area of the second area comprises a plurality of first unit areas in which a fourth, fifth, and sixth light emitting areas are disposed, and in which a plurality of opening areas are defined through the display panel,
wherein a number of the first, second, and third light emitting areas per a unit area in the first area is greater than a number of the fourth, fifth, and sixth light emitting areas per the unit area in the second area, and
each of the fourth, fifth, and sixth light emitting areas of the second area has an area greater than an area of a corresponding light emitting area of the first, second, and third light emitting areas of the first area,
wherein the fourth, fifth, and sixth light emitting areas in each of the plurality of first unit areas have a same arrangement as the first, second, and third light emitting areas in each of the plurality of second unit areas.

17. The display panel of claim 16, wherein the second area comprises:
a plurality of unit areas, wherein the fourth, fifth, and sixth light emitting areas are disposed in each of the plurality of unit areas; and
a plurality of stretchable areas disposed between the plurality of unit areas.

18. The display panel of claim 16, wherein the second area comprises:
an outside area in which the plurality of opening areas are defined; and
an inside area in which the plurality of opening areas are not defined.

19. The display panel of claim 18, wherein the fourth, fifth, and sixth light emitting areas of the outside area have a same arrangement as the fourth, fifth, and sixth light emitting areas of the inside area.

20. The display panel of claim 16, wherein
the second area comprises a plurality of unit areas,
the fourth light emitting area generates a first color light,
the fifth light emitting area generates a second color light,
the sixth light emitting area generates a third color light, and one fourth light emitting area, one fifth light emitting area, and two sixth light emitting areas are disposed in each of the plurality of unit areas.

\* \* \* \* \*